United States Patent [19]

Nishimura

[11] Patent Number: 5,007,014
[45] Date of Patent: Apr. 9, 1991

[54] RESET CIRCUIT FOR ELECTRONIC APPARATUS

[75] Inventor: Toshio Nishimura, Jyoyo, Japan

[73] Assignee: Sharp Kabushiki Kaisha, Osaka, Japan

[21] Appl. No.: 296,332

[22] Filed: Jan. 10, 1989

Related U.S. Application Data

[63] Continuation of Ser. No. 131,342, Dec. 9, 1987, abandoned, which is a continuation of Ser. No. 689,847, Jan. 9, 1985, abandoned.

[30] Foreign Application Priority Data

Jan. 11, 1984 [JP] Japan ................................ 59-4172
Jan. 20, 1984 [JP] Japan ................................ 59-8967

[51] Int. Cl.$^5$ .............................................. G06F 1/24
[52] U.S. Cl. .................................. 364/900; 371/16.3
[58] Field of Search ................. 371/12, 16.3, 21.1; 364/900

[56] References Cited

U.S. PATENT DOCUMENTS 4,405,982 9/1983 Ruhnau et al. ..................... 371/16.3
4,586,179 4/1986 Sirazi et al. ........................ 371/16.3

OTHER PUBLICATIONS

Leventhal, L. A. *Introduction to Microprocessors: Software, Hardware, Programming*, Prentice-Hall, 1978; p. 291.

*Primary Examiner*—David L. Clark
*Attorney, Agent, or Firm*—Flehr, Hohbach, Test, Albritton & Herbert

[57] ABSTRACT

An electronic apparatus includes a delay circuit which generates a delayed output signal to initial-clear the memory elements and a detection circuit for detecting a startup which operates at an operating voltage greater than the absolute value of any of the operating voltages of the memory elements. The output signal from the delay circuit is released on the basis of the output from the detection circuit. A reset circuit of this type obviates the need for a system reset key and thereby eliminates the disadvantages associated with such a key.

2 Claims, 7 Drawing Sheets

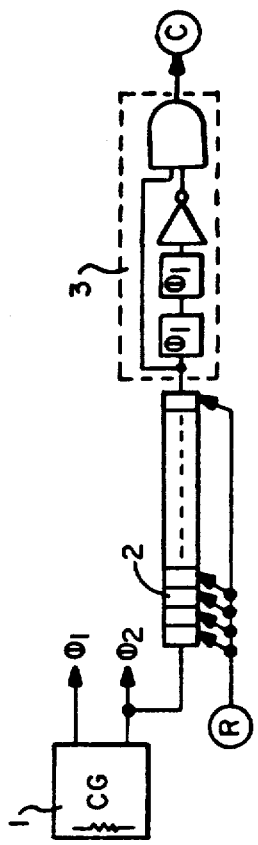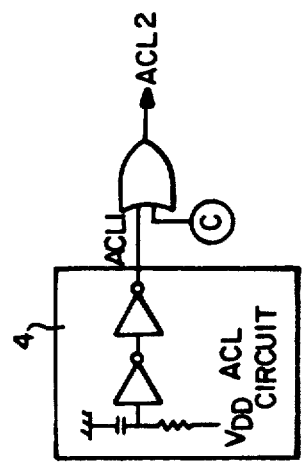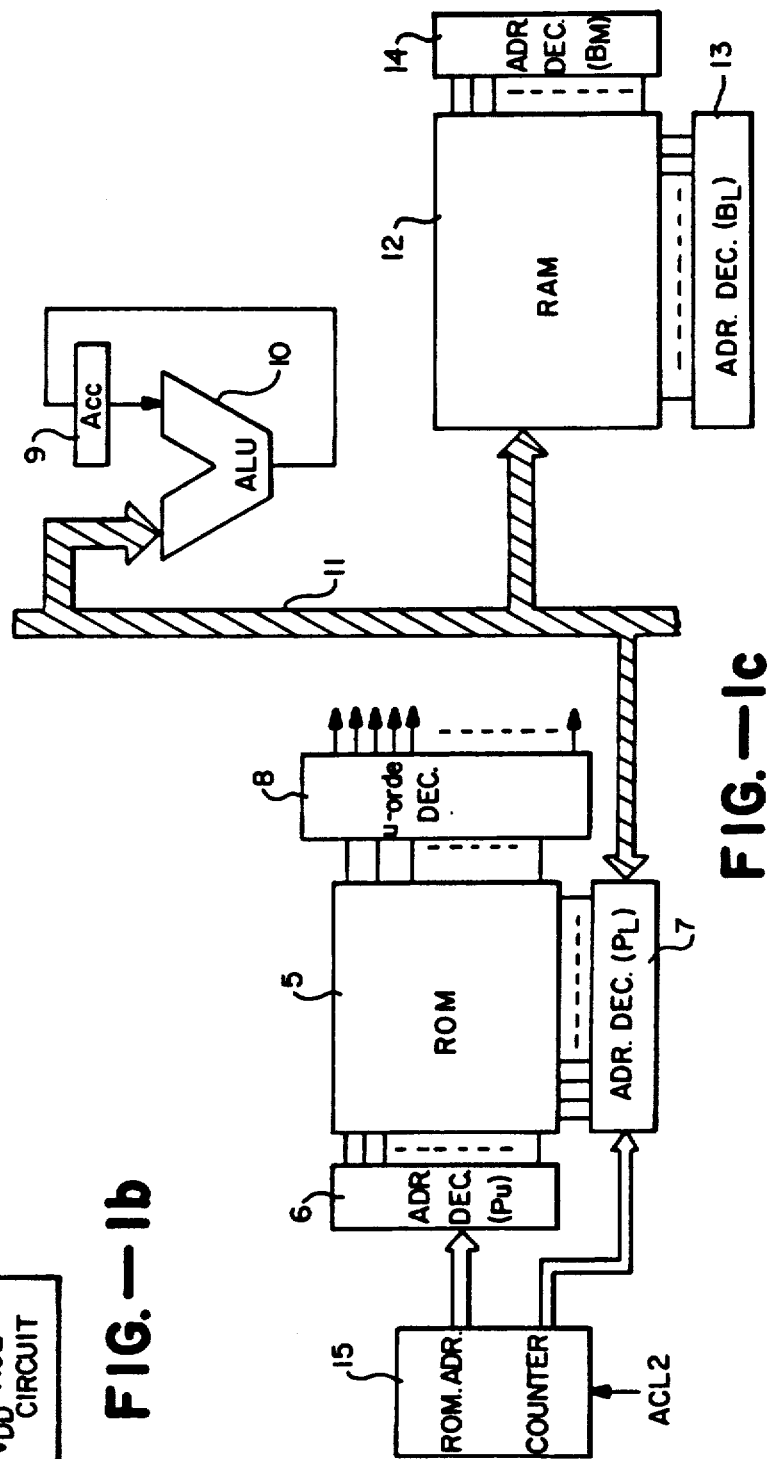

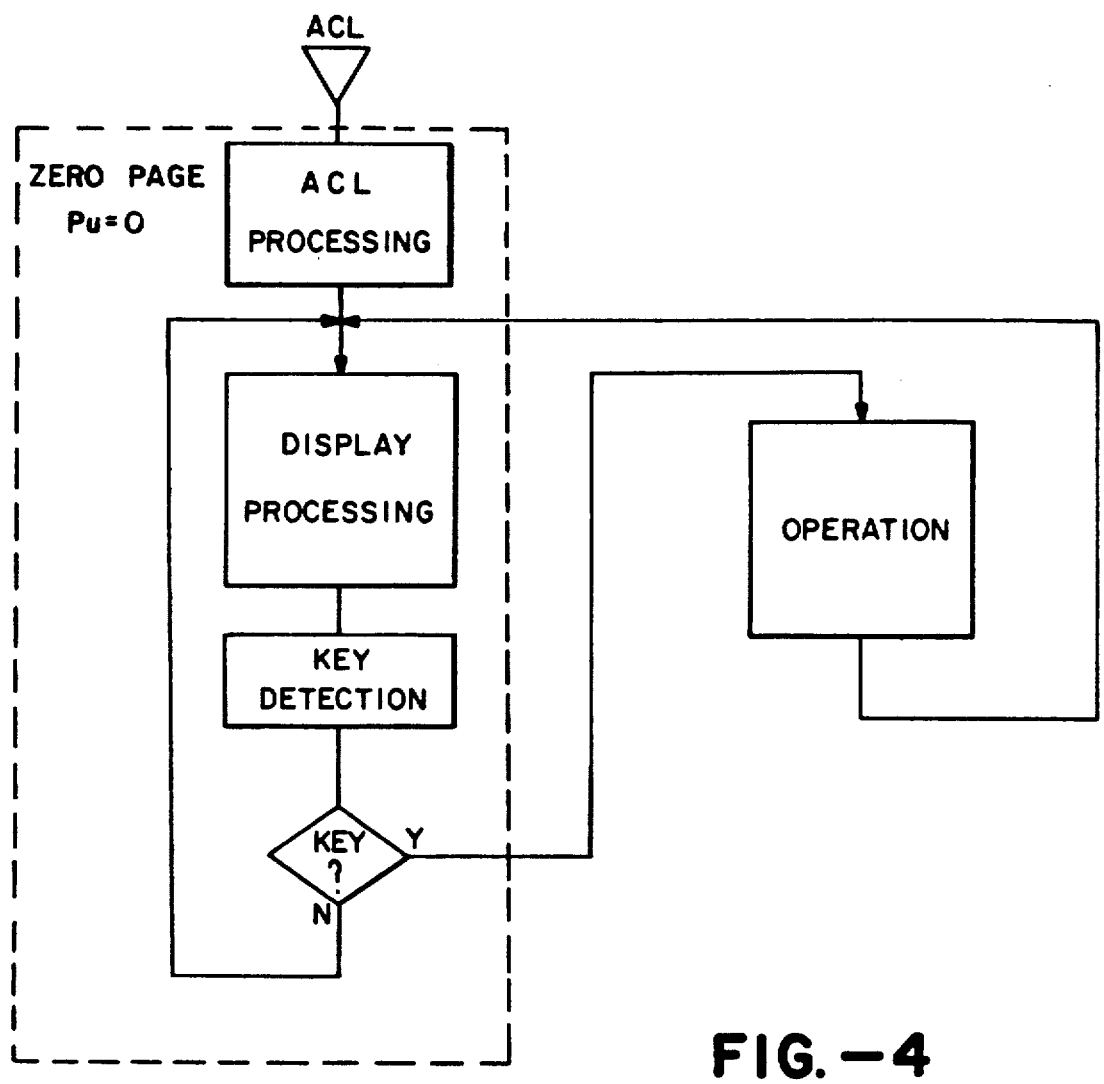
FIG.—4
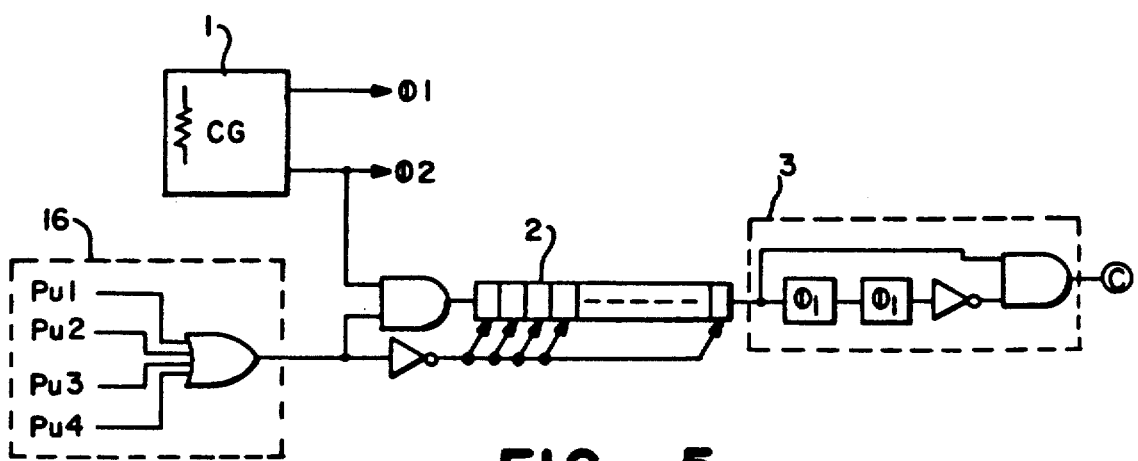
FIG.—5

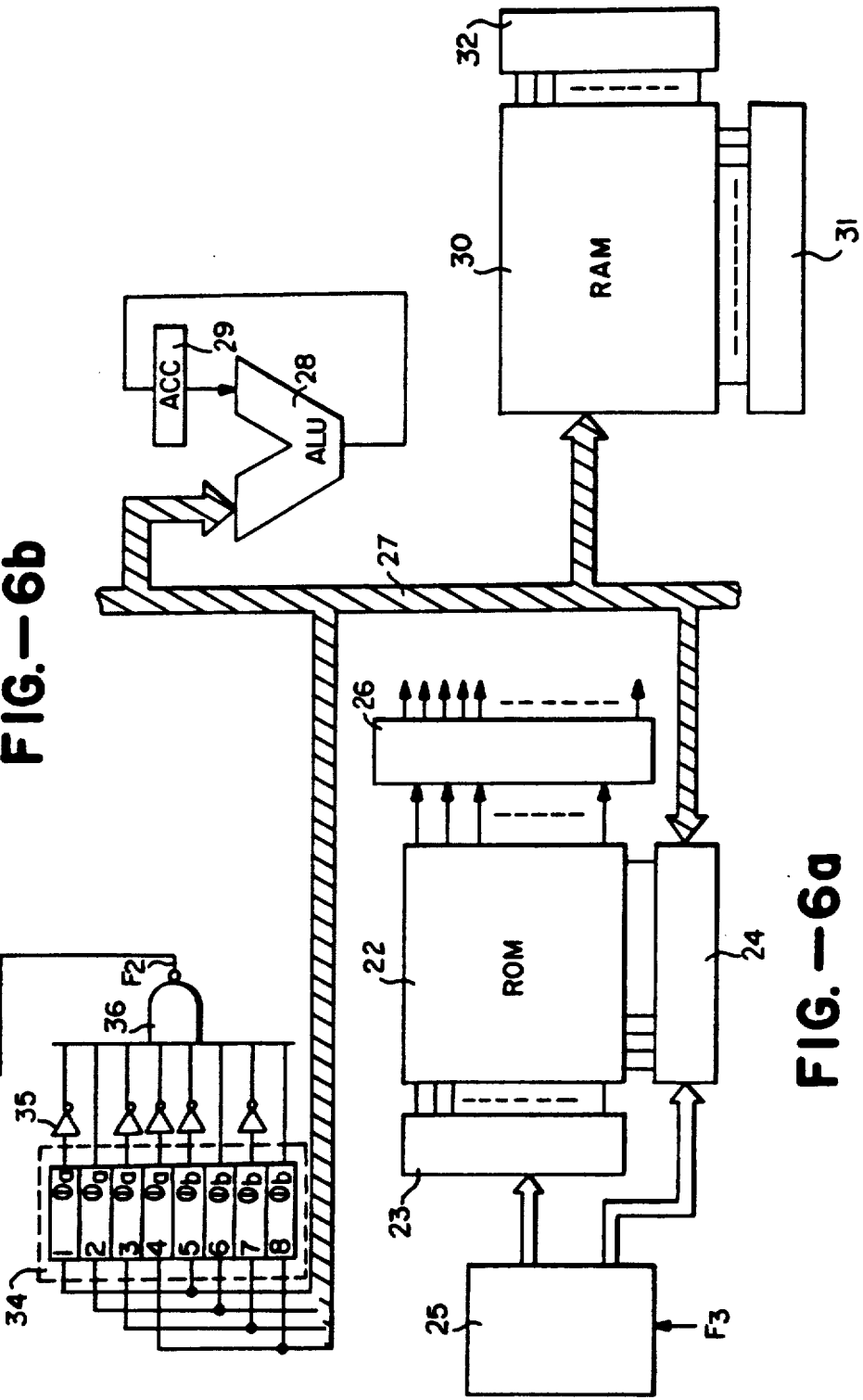
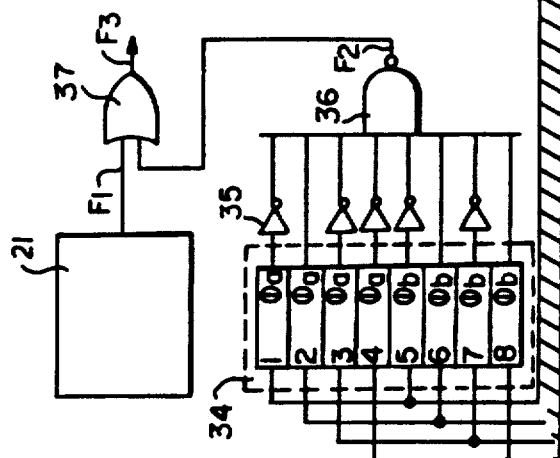
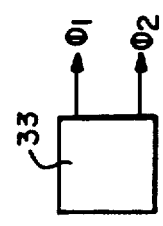
FIG.—6b
FIG.—6a

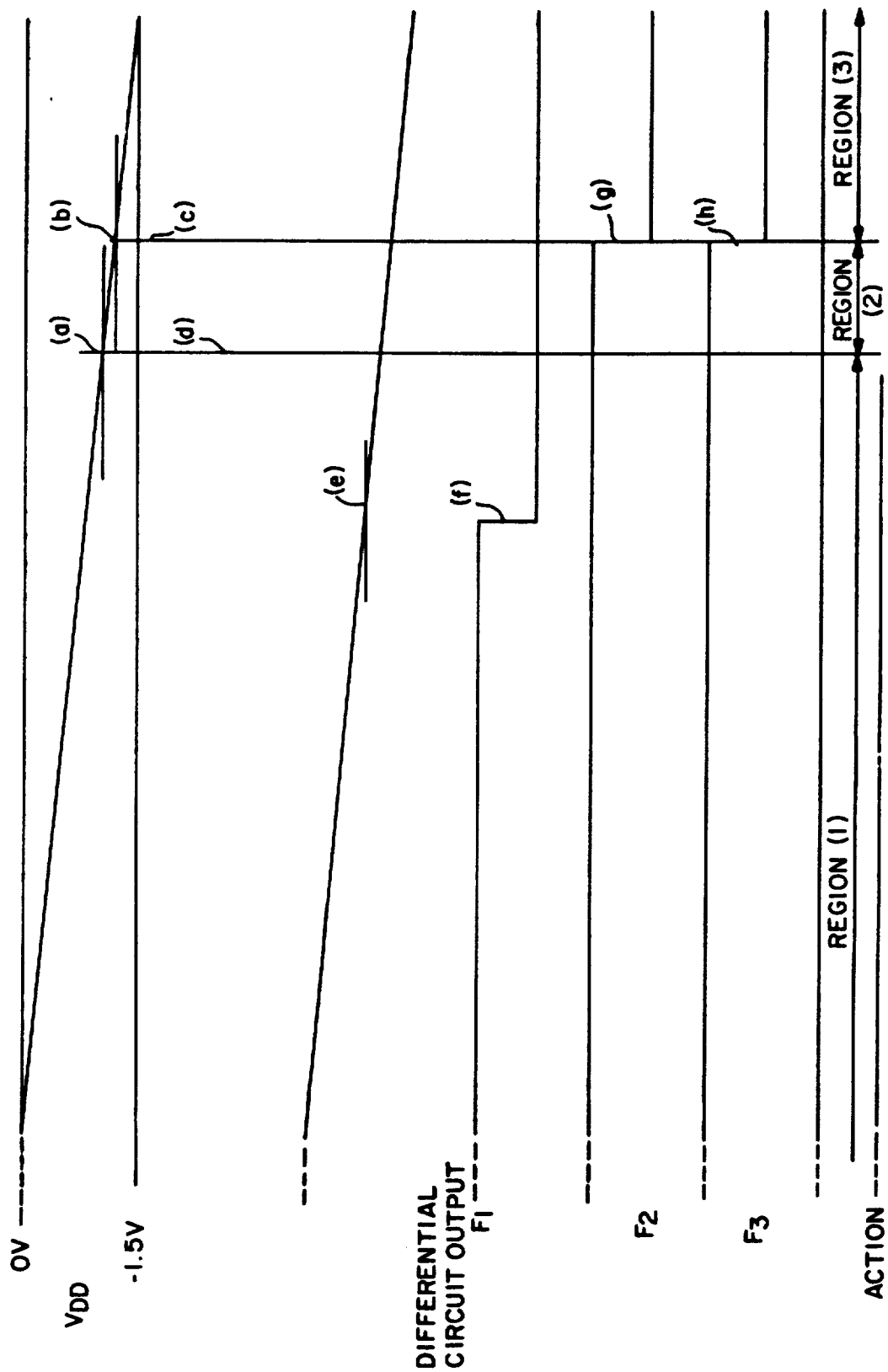

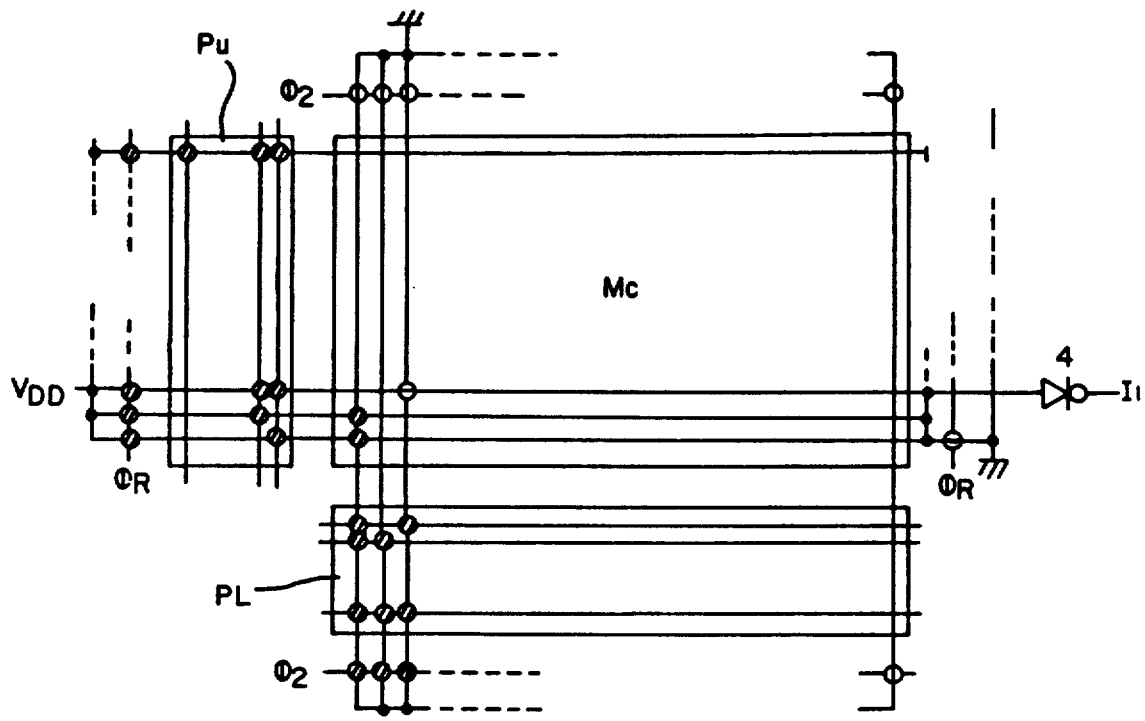
FIG.—8a
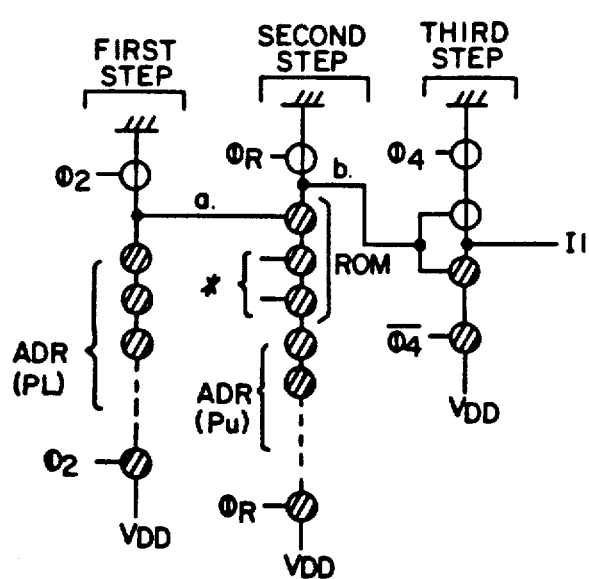
FIG.—8b

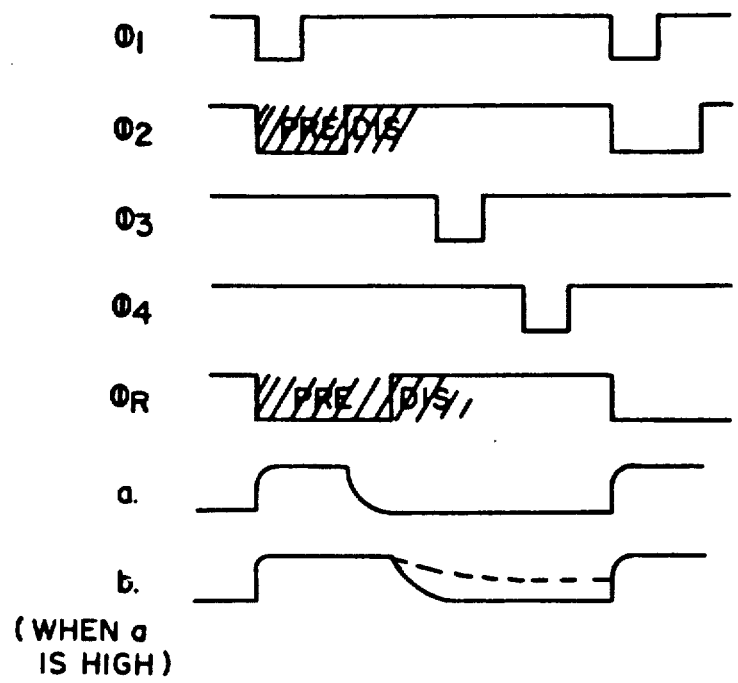
FIG.—8c
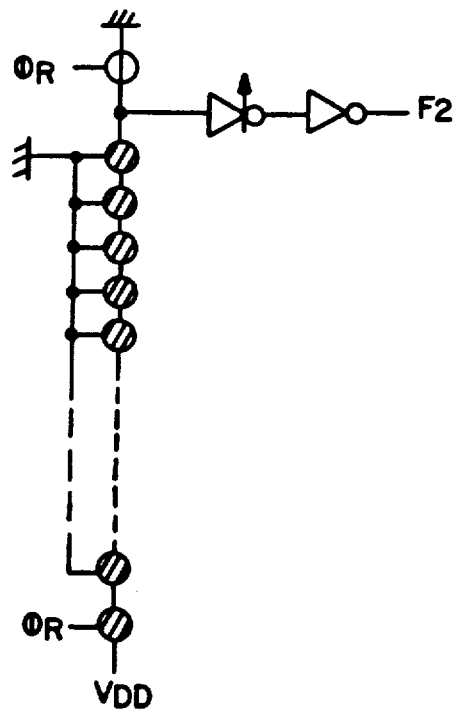
FIG.—9

RESET CIRCUIT FOR ELECTRONIC APPARATUS

This is a continuation of application Ser. No. 131,342 filed Dec. 9, 1987, now abandoned, which is a continuation of application Ser. No. 689,847 filed Jan. 9, 1985 now abandoned.

BACKGROUND OF THE INVENTION

This invention relates to a method of resetting a system and more particularly to a reset circuit for automatically clearing unnecessary memory contents of an information processing system independently of the variations in the power source voltage when the power is switched on.

In general, changes in light intensity cause significant variations in the power source voltage of an information processing system such as a calculator powered by a solar cell and this frequently results in a runaway situation in the arithmetic system. A conventional method of meeting this situation was to provide a hardware reset key for the entire system which can be used in the case of a runaway. Incorporation of such a key, however, complicates the operations and reduces the number of keys that can be more effectively used. It is therefore desirable to be dispensed with such a reset key.

It is therefore an object of this invention to eliminate from an electronic apparatus the disadvantages of hardware reset keys described above.

It is another object of this invention to provide a method of automatically resetting a system by making use of the infinite operation time of a runaway to make a comparison with the normal operation time of its arithmetic system and to detect a runaway.

It is a further object of this invention to provide an information processing system containing a reset circuit which is capable of reliably and automatically clearing the contents of all memory elements of the system independently of the variations in the power source voltage when the power is switched on, and hence is suitable in an integrated circuit design.

BRIEF DESCRIPTION OF DRAWINGS

FIGS. 1A-C are is a system diagram of an LSI embodying the present invention.

FIG. 4 is a program flow chart according to another embodiment of this invention.

FIG. 5 is a block diagram which shows the main part of this embodiment.

FIGS. 6A and 6B are a block diagram of a calculator with a solar cell embodying the present invention.

FIG. 7 shows the action of the calculator of FIG. 6.

FIG. 8A-C shows the action of a dynamic ROM.

FIG. 9 is an action detection circuit according to another embodiment of this invention.

DETAILED DESCRIPTION OF THE INVENTION

Figure 2:
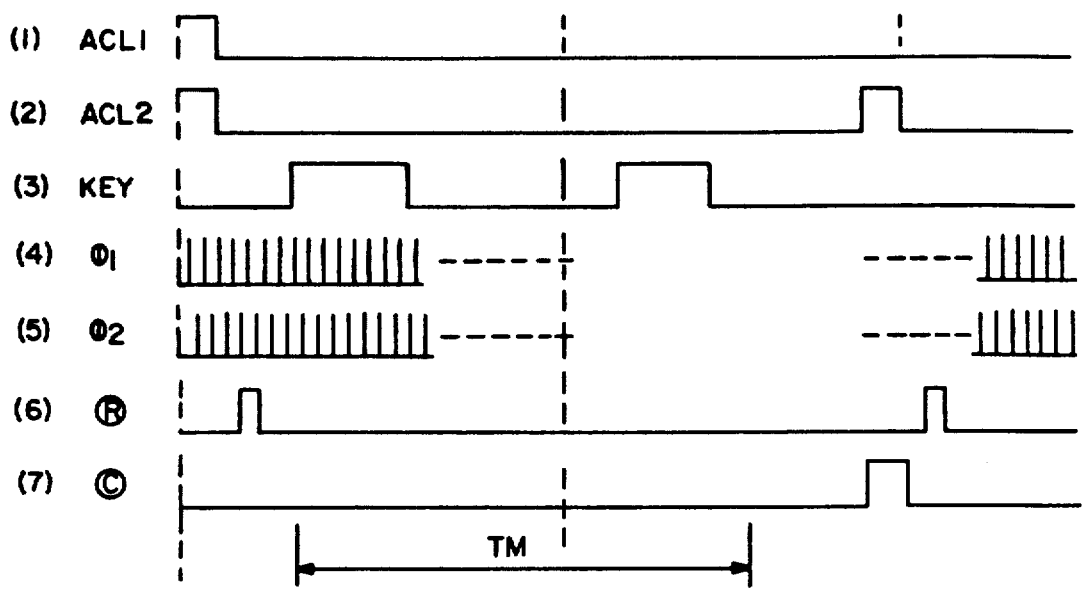
FIG. 2 is a time chart of the main signal of the LSI of FIG. 1.

There are shown in FIG. 1 a clock signal generator (CG) 1, a counter 2 for counting the operation time, a detection circuit 3 which detects a rise in the carry of the counter 2 and synchronizes it to the clock, an auto clear (ACL) circuit 4 which generates a predetermined signal ACL1 when the power is switched on, a ROM 5 for storing the program, address decoders 6 and 7 of the ROM 5, a micro-order decoder 8, an accumulator 9, an arithmetic and logic unit (ALU) 10, a bus 11, a RAM 12 used as a register and a flag, address decoders 13 and 14 of the RAM 12, and address counter 15 of the ROM 5. In FIG. 2, $T_B$ indicates the time at which a runaway occurs, $T_R$ is the time of system reset and $T_M$ shows the maximum value for the operation time.

When an electric potential is applied to the LSI and the system is activated, the ACL circuit 4 begins to operate and issues signals ACL1 and ACL2. When ACL2 is issued, the program starts from address ACL. Processing at ACL is done first, followed by display processing and key detection. Next, signal R for resetting the counter 2 is outputted and, if there is a key, the operation of that key is performed. If a runaway occurs during the operation as a result of an external cause such as a drop in the power source voltage, the program will not return to the same routine; the counting by the counter 2 continues and a carry is eventually generated. The length of time until the counter 2 generates a carry is set longer than the maximum normal operation time of that (software) system. As for the carry of the counter 2, the circuit 3 secures a length of one bit or more for its rise (signal C). Since signal ACL2 is the logical sum of signals ACL1 and C, ACL2 is issued if C is generated, resetting the address counter 15 of the ROM and returning the program to the address ACL. When the program begins to progress correctly again according to the flow chart, the entire system is reset by the ACL processing routine.

Figure 3:
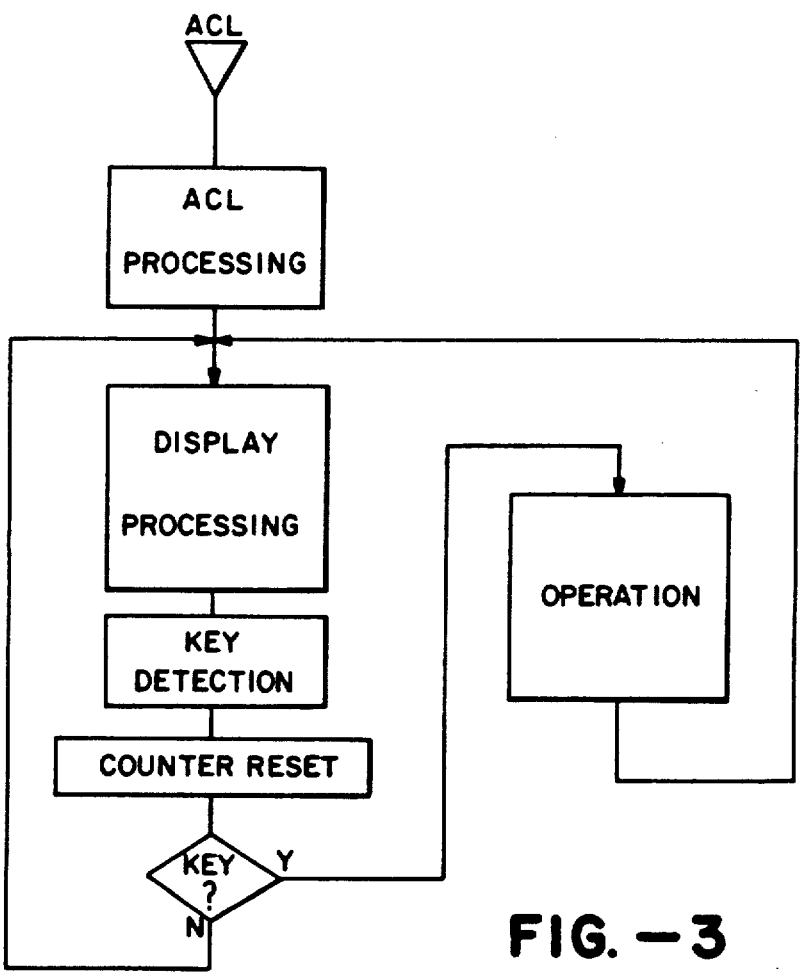
FIG. 3 is a program flow chart for the LSI of FIG. 1.

According to the examples of FIGS. 1-3, it is by the program that the counter 2 is reset. Reset may be effected, however, also by the method shown by FIGS. 4 and 5.

If a program in which a runaway does not occur such as ACL processing and the display routine is on the zero-page ($P_u = 0$) and the reset condition for the counter 2 is on the zero-page ($P_{u1} + P_{u2} + P_{u3} + P_{u4} = 0$), the counter 2 begins to count when a key is pressed to start the operation and the system moves out of the zero-page. The counter 2 is reset when the system returns to the display routine (zero-page) through a normal routine. When a runaway occurs, however, the system does not return to the zero-page and hence the counter 2 generates a carry. The rest is the same as in the previous example. In FIG. 5, No. 16 is a logical circuit for zero-page detection (a zero-page detection circuit).

In the case of a system employing the so-called clock-stop method (the method of generating only clock signals during the operation and stopping the clock during non-operation periods), the clock-stop condition itself can be used as the reset signal for the counter.

FIG. 6 shows by a block diagram a ROM-RAM type calculator with a solar cell according to the present invention. It comprises well-known circuits such as a delay circuit 21 which generates an output signal $F_1$ in response to a power entry after a predetermined period of time, a read only memory (ROM) 22 containing micro-programs such as the clear instruction, a Y address selection circuit ($P_u$) 23 for the ROM 22, an X address selection circuit ($P_L$) 24, an address counter 25 for the ROM 22, a micro-order decoder 26, a bus 27, an operation logical unit 28 for executing various operations, an accumulator 29 for temporarily storing various contents, a RAM 30 for storing the results of various operations, etc., address selection circuits 31 and 32 for the RAM, and a timing signal generating circuit 33.

According to the present invention, furthermore, there is provided a detection circuit 34 for detecting the start of action which is activated by a potential greater than the absolute value of the threshold voltage of any memory element so that the memory elements can always be reset independently of the variations in the power source voltage when power is switched on. In the case of the example shown, a latch circuit is used as the detection circuit 34. This latch circuit consists of 8 flip-flops and is so structured, for example, with an increased gate thickness for the MOS transistor that the threshold voltage is controlled and it will be operated with an action voltage which is greater than the absolute value of the startup voltage of any other circuit. In other words, it is so designed that the range of normal action is narrow and the action voltage margin is unfavorable. No. 35 is an inverter and No. 36 forms a NAND gate. The output $F_2$ of the NAND gate 36 is applied as one of the inputs to the OR gate 37 and the logical sum output $F_3$ with the other input from the delay circuit 21 is taken out of the OR gate 37.

The action of this ROM-RAM calculator will now be explained for a situation where the power source voltage $V_{DD}$ drops slowly after the power is entered. This, for example, is the case when the power source is a solar cell and the external light is weak. The power source voltage $V_{DD}$ drops gradually from 0 volt. When it reaches the point (a) in FIG. 7, circuits other than the detection circuit 34 start up. When the power source voltage drops further and reaches the point (b), the detection circuit 34 begins to operate as shown by (c). When the threshold voltage is reached at point (e), the reset pulse (or auto clear signal) $F_1$ drops at the point (f). In this situation (Region (1)), however, the system circuit cannot be cleared by this reset pulse $F_1$ because the power source voltage has not reached the point (a) at which the circuit system begins to operate. When the point (a) is reached, all circuits except the latch circuit 34 begin to operate normally. The ROM 32 does not start; since the latch circuit 34 has not reached the point b), the code signal from the bus line 7 is not correctly latched and $F_2$ will be "1" (HIGH). If $F_2 = 1$, the output $F_3$ of the OR gate 37 becomes "1" and the ROM 22 is set to the clear instruction address. In other words, the output $F_3$ places the address of the clear instruction of the ROM in the address selection circuit. There is written in the clear instruction address of the ROM an instruction to transmit a predetermined code to the latch circuit 34 so that this predetermined code continues to be transmitted from the time (a) when the power source voltage $V_{DD}$ reaches the operating voltage until it reaches the action voltage of the latch circuit 34 is reached at point (b). This time interval is designated as Region (2) in FIG. 7. When the power source voltage reaches the point (b), the code signal from the bus line 7 is correctly latched so that the output $F_2$ drops (as shown by (g)) and becomes zero. The output $F_3$ from the OR gate 37 also becomes zero, and the ROM 22 is released from the clear instruction address to start execution according to the correct program. This corresponds to Region (3) of FIG. 7. In summary, the output $F_1$ from the delay circuit 21 is released (or reversed) at (f) before the starting of the system operating voltage at (d) but, if the detection circuit 34 is provided, $F_3$ is outputted as if $F_1$ had been released or reversed by the output $F_2$ from the detection circuit 34. In the case of the embodiment of FIG. 6, the code signal from the bus 7 is of an 8-bit structure (01000101). Accuracy of operation improves as the number of latches is increased.

Although a latch circuit was used as the detection circuit 34 in the example above, it is also possible to make use of the action characteristics of a ROM. FIG. 8(1) is a circuit block diagram of a dynamic ROM wherein $M_c$ is a memory cell array, $P_L$ is an X address selection circuit and $P_u$ is a Y address selection circuit. FIG. 8(2) is a circuit diagram of a specific bit cell of the dynamic ROM, while FIG. 8(3) is a time chart which shows the phase relationship among the clock pulses. In FIG. 8(2), white circles are p-channel type MOS transistors or precharge transistors while shaded circles are n-channel type MOS transistors, or discharge transistors. When the ROM is operating normally, an in-page address of the address selection circuit $P_L$ is selected first. As shown in FIG. 8(3), $\phi_2$ is precharged in the case of LOW "1" (negative logic) and is discharged in the case of HIGH "0". If the address ($P_L$) line is all selected in the first step, the logic at point a becomes LOW "1" when it is discharged by $\phi_2$. It is then precharged by $\phi_R$ and discharged by $\phi_R$ in the second step. At point b, it becomes HIGH "0" becomes it is not discharged. The third stage is provided for waveform shaping and synchronization of $\phi_4$. The output signal $I_1$ of the ROM is applied to the micro-order decoder 26. The number of steps in ROM division marked by * in the second step varies, depending on the contents of the software. It is known as a general characteristic of a dynamic ROM that errors often occur when the power source voltage drops because the discharge of MOS transistor cannot be executed. It may be because discharge transistors have far more steps than precharge transistors. When discharge becomes insufficient, both points a and b become HIGH while the ROM output signal $I_1$ becomes LOW so that the instruction signal is always outputted. FIG. 9 shows an example of detection circuit of this invention which makes use of such properties of ROM operation. There is shown a transistor with more steps than the largest number of steps of any n-channel MOS discharge transistor in the ROM. Such structure can provide a circuit with a range of operating voltage as narrow as that of the latch circuit described before. The output $F_2$ of this circuit can similarly be applied to the OR gate as shown in FIG. 6 so that the system can be cleared even if the power source voltage drops slowly.

What is claimed is:

1. A reset circuit for an electronic apparatus capable of outputting a reset signal when power is switched on for said apparatus, said reset circuit comprising
   memory means for storing programs for said apparatus, said memory means storing an all-clear code at a specified address therein,
   an address counter for addressing said memory means, said address counter causing said all-clear code to be outputted from said memory means if said address counter is in a reset condition, and
   control means which serves to check whether or not said memory means is outputting said all-clear code and to release said address counter from said reset condition if said memory means is thereby found to be outputting said all-clear code such that said address counter can cause said memory means to output operation programs for said electronic apparatus.

2. The reset circuit of claim 1 further comprising a time counter, said control means releasing said address counter from said reset condition also if said time counter counts a predetermined time interval after power is switched on said apparatus.

* * * * *